US009502310B1

United States Patent
Li et al.

(10) Patent No.: US 9,502,310 B1
(45) Date of Patent: Nov. 22, 2016

(54) INTEGRATION METHOD FOR A VERTICAL NANOWIRE TRANSISTOR

(71) Applicant: PEKING UNIVERSITY, Beijing (CN)

(72) Inventors: Ming Li, Beijing (CN); Yuancheng Yang, Beijing (CN); Gong Chen, Beijing (CN); Jiewen Fan, Beijing (CN); Hao Zhang, Beijing (CN); Ru Huang, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 0 days.

(21) Appl. No.: 15/078,789

(22) Filed: Mar. 23, 2016

(30) Foreign Application Priority Data

Oct. 26, 2015 (CN) .......................... 2015 1 0701681

(51) Int. Cl.
| | |
|---|---|
| *H01L 21/00* | (2006.01) |
| *H01L 21/8238* | (2006.01) |
| *H01L 29/06* | (2006.01) |
| *H01L 29/66* | (2006.01) |
| *H01L 21/02* | (2006.01) |
| *H01L 21/306* | (2006.01) |
| *H01L 21/308* | (2006.01) |
| *H01L 29/08* | (2006.01) |
| *H01L 21/768* | (2006.01) |

(52) U.S. Cl.
CPC . *H01L 21/823885* (2013.01); *H01L 21/02603* (2013.01); *H01L 21/02636* (2013.01); *H01L 21/3081* (2013.01); *H01L 21/30604* (2013.01); *H01L 21/30625* (2013.01); *H01L 21/76802* (2013.01); *H01L 21/76877* (2013.01); *H01L 21/823814* (2013.01); *H01L 21/823828* (2013.01); *H01L 21/823871* (2013.01); *H01L 21/823878* (2013.01); *H01L 29/0649* (2013.01); *H01L 29/0676* (2013.01); *H01L 29/0847* (2013.01); *H01L 29/66545* (2013.01)

(58) Field of Classification Search
CPC .................. H01L 21/02636; H01L 21/02603; H01L 21/823885; H01L 21/76802; H01L 21/30604; H01L 21/30625; H01L 21/3081; H01L 21/823814; H01L 21/823828; H01L 21/823871; H01L 29/0649; H01L 29/66545; H01L 29/0676
See application file for complete search history.

(56) References Cited

U.S. PATENT DOCUMENTS

| 7,892,956 B2 * | 2/2011 | Deligianni ............. B82Y 10/00 257/E29.262 |
| 2011/0233512 A1 * | 9/2011 | Yang ...................... B82Y 10/00 257/9 |

(Continued)

OTHER PUBLICATIONS

"Vertical Silicon-Nanowire Formation and Gate-All-Around MOSFET" published on IEEE Electron Device Letters, vol. 29, No. 7, Jul. 2008, D. L. Kwong et al. (pp. 791-794).

*Primary Examiner* — Richard Booth
(74) *Attorney, Agent, or Firm* — K&L Gates LLP

(57) ABSTRACT

The present invention discloses a method for integrating a vertical nanowire transistor and belongs to a field of field effect transistor logic device in a CMOS ultra-large scale integrated circuit (ULSI). The method realizes the integration of the vertical-nanowire transistor by combining selective epitaxy and replacement gate on sidewall. In comparison with an existing method for forming a vertical nanowire channel by etching, a size and shape of a cross section of a device channel can be accurately controlled, a consistency of device characteristic can be improved, and an etching damage during the forming of a channel in the existing method can be avoided, thereby the device performance can be improved.

7 Claims, 12 Drawing Sheets

(56) References Cited

U.S. PATENT DOCUMENTS

2014/0166981 A1* 6/2014 Doyle ............... H01L 29/66666
257/24

2015/0171032 A1* 6/2015 Colinge ................. H01L 23/60
257/355

* cited by examiner (a)

(b)

(a)

(b)

INTEGRATION METHOD FOR A VERTICAL NANOWIRE TRANSISTOR

CROSS REFERENCE TO RELATED APPLICATIONS

This application claims priority under 35 U.S.C. §119(a) to Chinese Patent Application Number 201510701681.9, entitled INTEGRATION METHOD FOR A VERTICAL NANOWIRE TRANSISTOR, filed on Oct. 26, 2015, the disclosures of which are incorporated herein by reference in their entirety.

FIELD OF THE INVENTION

The present invention relates to the field of ultra-large scale integrated circuit manufacturing technologies, and in particular, to a method for integrating a vertical-nanowire transistor by combining selective epitaxy and replacement gate on sidewall.

BACKGROUND OF THE INVENTION

As semiconductor devices entering the 22 nm technique node, a horizontal channel 3D multi-gate device (MuGFET) represented by a fin-type field effect transistor (FinFET) becomes a main stream of semiconductor device due to the advantages of outstanding ability of suppressing short-channel effect, high integration density and compatibility with traditional CMOS processes, etc.

However, as scaled down to a smaller size technical node, the horizontal channel 3D multi-gate device faces the challenges that it is difficult to reduce the spacing of contact holes (which limits the increase of integration density) and gate etching is performed on a complex shape, etc.

By contrast, a vertical channel gate-all-around device gains much attention due to the advantages of higher integration density and a potential of hybrid integration with novel memories (for example, RRAM, etc.).

At present, a integration solution of a vertical nanowire device is mainly reported in *Method For Forming A Channel Based On Etching*, by B. Yang, et al., in EDL, 2008, 29 (7): 791~794.

In this method, a vertical channel with a diameter of 20 nm and an aspect ratio greater than 50:1 is formed on a bulk silicon substrate by etching, and a source/drain of the device is formed by implantation, wherein a traditional $SiO_2$ gate oxide and a polysilicon gate electrode are used.

However, when this method is employed to form a vertical nanowire channel device with a smaller size, the following problems will occur:

When a vertical channel with a smaller diameter and a large aspect ratio is formed by etching, a great challenge will be presented on the etching process, and it is difficult to control the cross-section shape of the channel formed by etching, thus the consistency of the device characteristics will be degraded; and channel damage caused by etching will further degrade the device performance;

An upper active region of the device formed by this method is a part of the vertical nanowire formed by etching, and the cross sectional area thereof decreases as the device size decreases, thus it is difficult to carry out heavy doping in this region by ion implantation, and the fluctuation of impurity concentration in this region between devices increases as the device size decreases;

It is difficult to employ a gate last process in this integration solution, which limits the improving of the device performance;

Therefore, there is an urgent need of an integration method of realizing a small-size vertical channel nanowire transistor in the industry.

SUMMARY OF THE INVENTION

As directed to the above problem, this invention provides a method for integrating a vertical-nanowire transistor by combining selective epitaxy and replacement gate on sidewall, to improve existing known technologies; as shown in FIG. 1, the method includes the steps of:

A) providing a semiconductor substrate, and forming an isolation between devices;

B) forming heavily-doped lower active regions of the devices, which are lower source terminals (or drain terminals) of a vertical transistor;

C) depositing a dummy gate stack, which specifically comprises the steps of:

C1) depositing a medium layer as a source-drain extension region (SDE) mask layer 1, of which a thickness defines a length of the SDE (i.e., LDD) of the devices;

C2) depositing a medium layer as a dummy gate layer, of which the thickness defines a channel length Lg of the devices;

C3) depositing a medium layer as a SDE mask layer 2, of which the thickness defines the length of the SDE (i.e., LDD) of the devices;

Wherein, materials of the SDE mask layer 1 and the SDE mask layer 2 are the same as each other, but are different from a material of the dummy gate layer. Moreover, it is required that an isotropic etching selection ratio of the material of the dummy gate layer to the material of the SDE mask layer 1 is greater than 5:1 to ensure that the SDE mask layer 1 and the SDE mask layer 2 are not damaged when the dummy gate layer is removed via isotropic etching in F4;

D) forming channels by selective epitaxy, which specifically comprises the steps of:

D1) defining epitaxial windows of the channels via lithography, of which sizes and shapes determine sizes and shapes of cross sections of the channels of the devices;

D2) forming the epitaxial windows of the channels via anisotropic etching, through the bottom of which heavily-doped lower active regions of the devices are exposed; and D3) forming the channels of the devices via epitaxy, and removing an epitaxial channel material that exceeds an upper surface of the SDE mask layer 2 via CMP, to realize planarization;

E) forming heavily-doped upper active regions of the devices by selective epitaxy, which are upper drain terminals (or source terminals) of the vertical transistor; this step specifically comprises the steps of:

E1) depositing a medium layer as a hard mask, and exposing channels of the NMOSs via lithography and anisotropic etching;

E2) forming heavily-doped upper active regions of the NMOSs via in-situ doped epitaxy;

E3) removing the hard mask;

E4) depositing a medium layer as a hard mask, and exposing channels of the PMOSs via lithography and anisotropic etching;

E5) forming a heavily-doped upper active region of the PMOS via in-situ doped epitaxy;

E6) removing the hard mask; and

E7) activating source-drain impurities via an annealing process, and diffusing the source-drain impurities into the SDE region to form an LDD;

Wherein, in E1 and E4, a material of the hard mask is different from the material of the SDE mask layer 2, and it is required that isotropic etching selection ratios of the hard mask to the SDE mask layer 2 and the epitaxial channel are greater than 5:1, to ensure that the SDE mask layer 2 and the epitaxial channel are not damaged when the hard mask is removed via anisotropic etching;

F) removing the dummy gate, depositing an HKMG and forming a gate electrode, which specifically comprises the steps of:

F1) depositing a medium layer as a top mask layer;

F2) defining a gate electrode via lithography;

F3) exposing an upper surface of the SDE mask layer 1 via anisotropic etching;

F4) removing the whole dummy gate layer via isotropic etching;

F5) depositing a high-K (HK) medium material as gate oxide and a metal gate (MG) material sequentially;

F6) removing the HKMG material that is not covered by the top mask layer via anisotropic etching to expose the upper surface of the SDE mask layer 1;

Wherein, in F1, a material of the top mask layer is different from the material of the dummy gate layer, and it is required that the isotropic etching selection ratio of the material of the dummy gate layer to the top mask layer is greater than 5:1 to ensure that the top mask layer is not damaged when the dummy gate layer is removed via isotropic etching in F4; in F1, a thickness of the top mask layer should be thick enough to ensure that the top mask layer still remains on the upper active region of the device after removing the HKMG material that is not covered by the top mask layer via anisotropic etching to expose the upper surface of the SDE mask layer 1 in F6;

H) forming a metal contact on each terminal of the device, which specifically comprises the steps of:

H1) depositing a medium layer as an inter-layer isolation, and planarized via CMP;

H2) forming a contact hole on each terminal of the device via lithography and anisotropic etching;

H3) filling each contact hole with a metal Metal 0; and

H4) realizing the separation of conductive layers between devices by performing CMP on the metal Metal 0, to realize an effect of device isolation;

I) accomplishing device integration subsequently by a backend process that has been disclosed.

Further, the structure parameters (for example, the thicknesses and doping concentrations of the upper active region and the lower active region, the thicknesses of the SDE mask layer 1, the SDE mask layer 2 and the dummy gate layer, and the material and thickness of the HKMG, etc.) in the invention are all set according to performance requirements of a specific device;

Further, the semiconductor substrate in A) includes a bulk silicon substrate, an SOI substrate, a bulk germanium substrate, a GOI substrate and a compound substrate, etc.;

Further, in A), for a bulk substrate (a bulk silicon, a bulk germanium, etc.), the isolation may employ a well isolation plus shallow trench isolation (STI); and for an SOI substrate and a GOI substrate, etc., the isolation may employ a shallow-trench isolation;

Further, in B), the lower active regions may be formed by implantation or patterned in-situ doped epitaxy, and the latter is preferred (in comparison with the implantation, in-situ doped epitaxy has a higher impurity concentration, a more optimized impurity distribution and a smaller impurity activation heat budget);

Further, in B) and E), it is not specified which one of the upper active region and the lower active region functions as the source terminal of the device and which one functions as the drain terminal of the device, and it may be set according to the performance of the device and the convenience of subsequent interconnection;

Further, in D), the material of the device channel formed via epitaxy may be the same as that of the lower active region (for example, a Si channel formed on a heavily-doped Si lower active region via epitaxy), or may be different from that of the lower active region (for example, a Si channel formed on the N+ heavily-doped GeSi lower active region via epitaxy, and a Ge channel is formed on the P+ heavily-doped GeSi lower active region via epitaxy); the device channel may be undoped, or may be a doped channel formed via in-situ doped epitaxy or ion implantation.

Further, in F), the HKGM material requires that a good interfacial characteristic, a good thermal stability and a chemical stability exist between the HK medium and the channel and between MG and HK, and atomic layer deposition (ALD) with good shape preservation is preferably taken as the deposition method;

Further, in H), it is required that the filler metal Metal 0 of the conductive layer has a low resistivity, and may be selected from W and Cu, etc.

The invention has the following advantages and positive effects:

1) In comparison with the existing method for forming a vertical nanowire channel by etching, by the integration method of combining selective epitaxy and replacement gate on sidewall of this invention, the size and shape of the cross section of a device channel can be accurately controlled, the consistency of device characteristic can be improved, and the etching damage in a process for forming the channel in the existing method can be avoided, thereby the device performance can be improved;

2) Hybrid integration of channels or sources and drains of various materials can be realized flexibly by the invention, which is difficult to be realized by the existing method for forming a vertical nanowire channel by etching;

3) An active region formed by a method of in-situ doped epitaxy presented by the invention solves a series of problems in the existing method of forming an active region via implantation that it is difficult to realize source-drain doping, it is difficult to control impurity distribution, the activation concentration of the source-drain impurity is low, and the like, thereby the device performance may be improved;

4) By the replacement gate on sidewall solution (gate last process) of the invention, the problem of the existing method for forming a vertical nanowire channel by etching can be solved that it is difficult to realize a replacement gate, thus device characteristic may be improved.

BRIEF DESCRIPTION OF THE DRAWINGS

FIGS. 2-18 are schematic diagrams showing respective key processes of a bulk silicon vertical nanowire CMOS device, and in each figure, (a) is a top view, and (b) is the sectional view of along the line A-A' in (a); wherein:

FIG. 2 is a diagram illustrating that double wells and an STI isolation are formed;

FIG. 3 is a diagram illustrating that a heavily-doped lower active region of the device is formed by in-situ doped epitaxy;

FIG. 4 is a diagram illustrating that a dummy gate stack layer is formed by deposition;

FIG. 5 is a diagram illustrating that an epitaxial window of a channel is formed by lithography and etching;

FIG. 6 is a diagram illustrating that a channel of a device is formed by epitaxy;

FIG. 7 is a diagram illustrating that planarization is performed by CMP;

FIG. 8 is a diagram illustrating that a heavily-doped upper active region of a NMOS is formed via in-situ doped epitaxy;

FIG. 9 is a diagram illustrating that a heavily-doped upper active region of a PMOS is formed via in-situ doped epitaxy;

FIG. 10 is a diagram illustrating that a top mask layer is deposited;

FIG. 11 is a diagram illustrating that gate patterning is formed by lithography and etching, and the dummy gate is removed;

FIG. 12 is a diagram illustrating that a HKMG material is deposited sequentially;

FIG. 13 is a diagram illustrating that gate electrodes are formed via anisotropic etching;

FIG. 14 is a diagram illustrating that an isolation layer is deposited;

FIG. 15 is a diagram illustrating that a contact hole on each terminal of the device is formed by lithography and etching;

FIG. 16 is a diagram illustrating that a metal Metal 0 is filled in the contact holes;

FIG. 17 is a diagram illustrating that isolation of conductive layers of the device is realized;

FIG. 18 is a legend of FIG. 2-FIG. 17;

FIGS. 19-23 are schematic diagrams showing respective process steps of a hybrid channel vertical nanowire CMOS device on an SOI substrate. In each figure, (a) is a top view, and (b) is the sectional view of along the line A-A' in (a); wherein:

FIG. 19 is a diagram illustrating that a heavily-doped lower active region of the device is formed on the SOI substrate by epitaxially growing GeSi;

FIG. 20 is a diagram illustrating that a P-type lightly-doped Si channel is formed on the lower active region of an NMOS, and an N-type lightly-doped Ge channel is formed on the lower active region of a PMOS, respectively;

FIG. 21 is a diagram illustrating that a heavily-doped GeSi upper active region of the device is epitaxially grown, and a top mask is deposited;

FIG. 22 is a diagram illustrating that a metal contact is formed on each terminal of the device;

FIG. 23 is a legend of FIG. 19-FIG. 22.

DETAILED DESCRIPTION OF THE EMBODIMENTS

The invention will be illustrated in detail below in conjunction with the drawings and specific embodiments.

Embodiment 1

Figure 1:
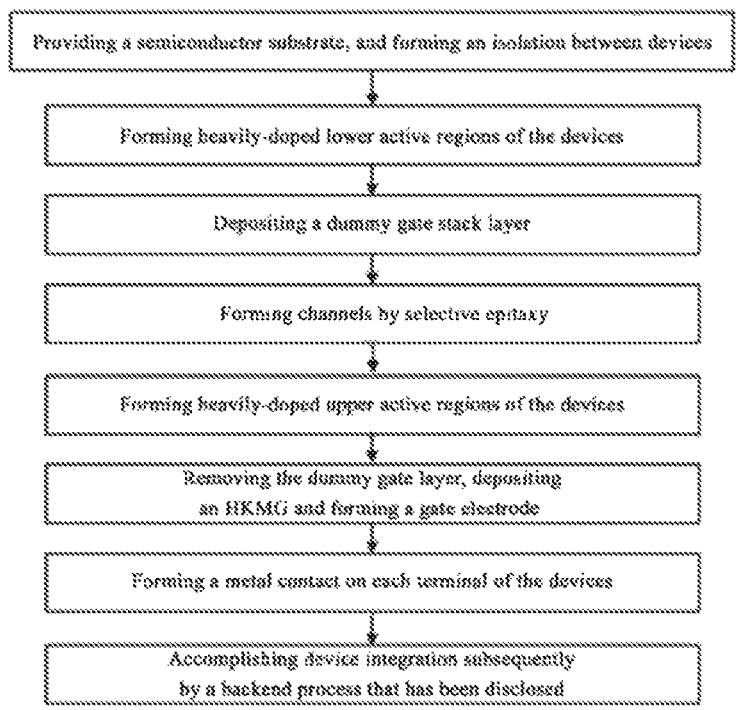
FIG. 1 is a flow chart of a method for integrating a vertical-nanowire transistor by combining selective epitaxy and replacement gate on sidewall according to the invention.
Figure 2:
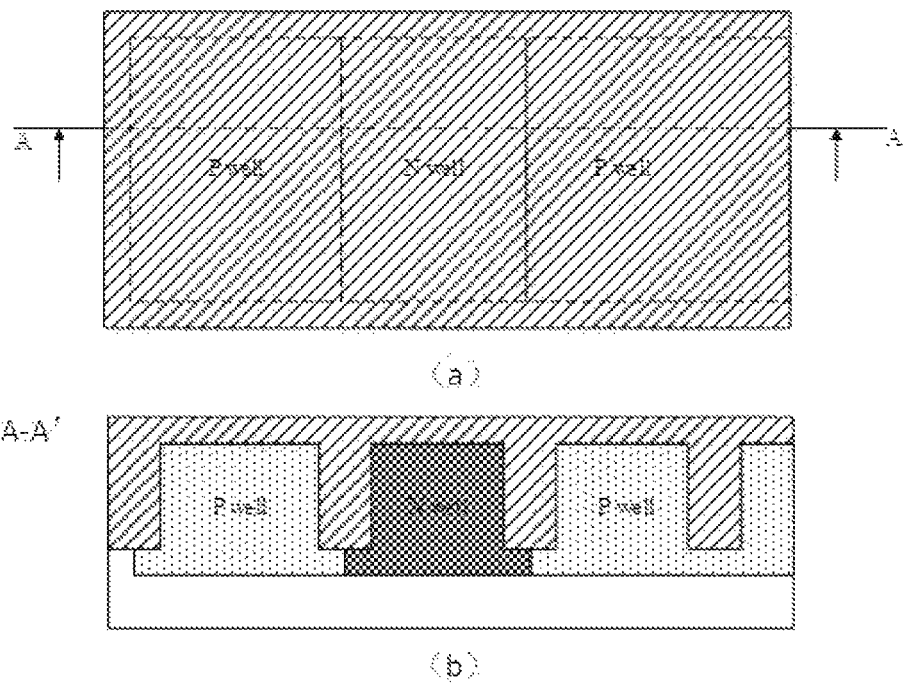
Figure 3:
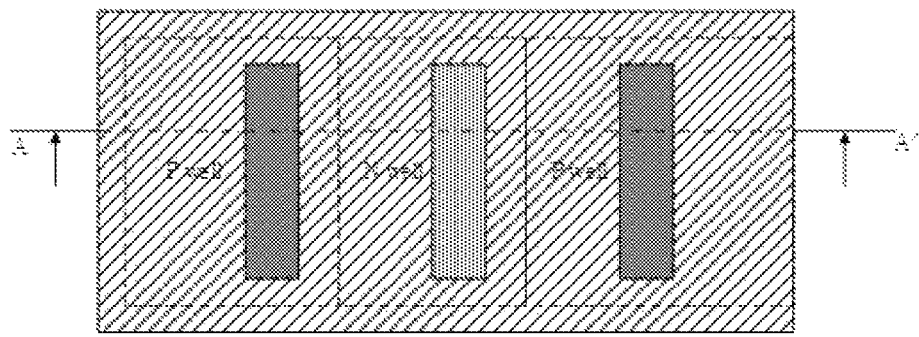
Figure 3:
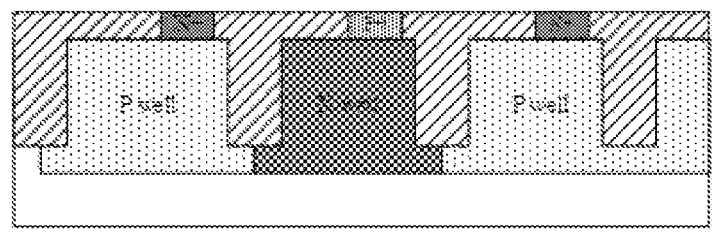
Figure 4:
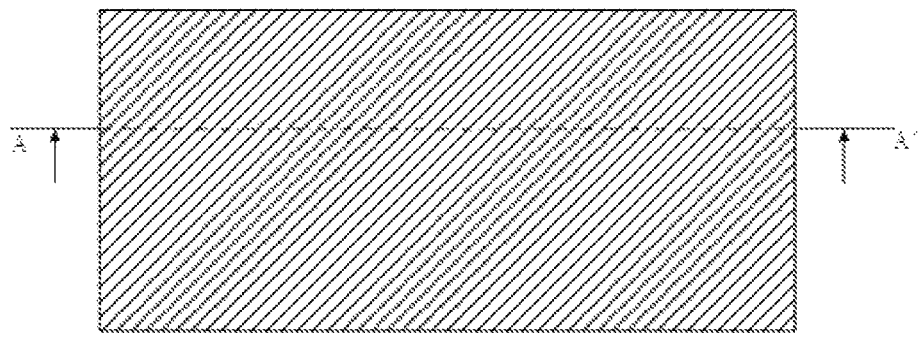
Figure 4:
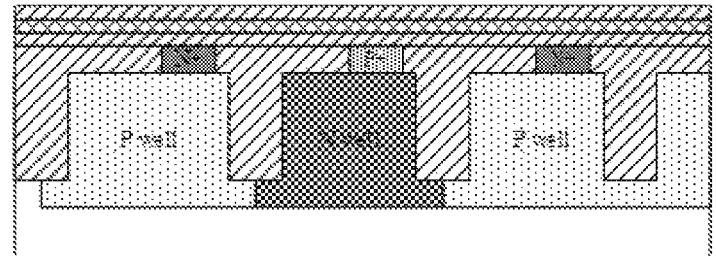
Figure 5:
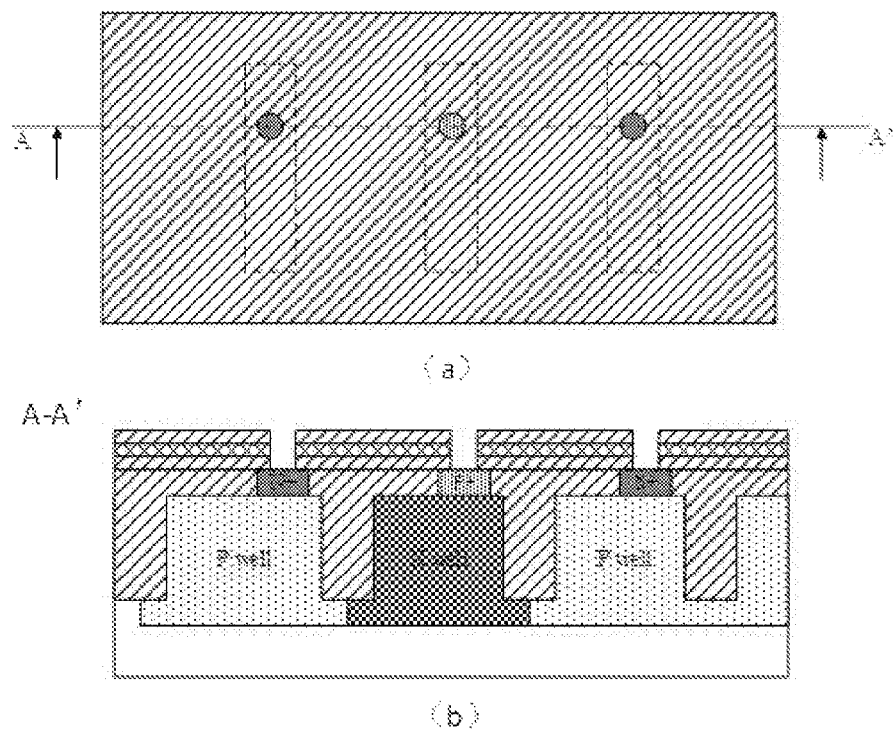
Figure 6:
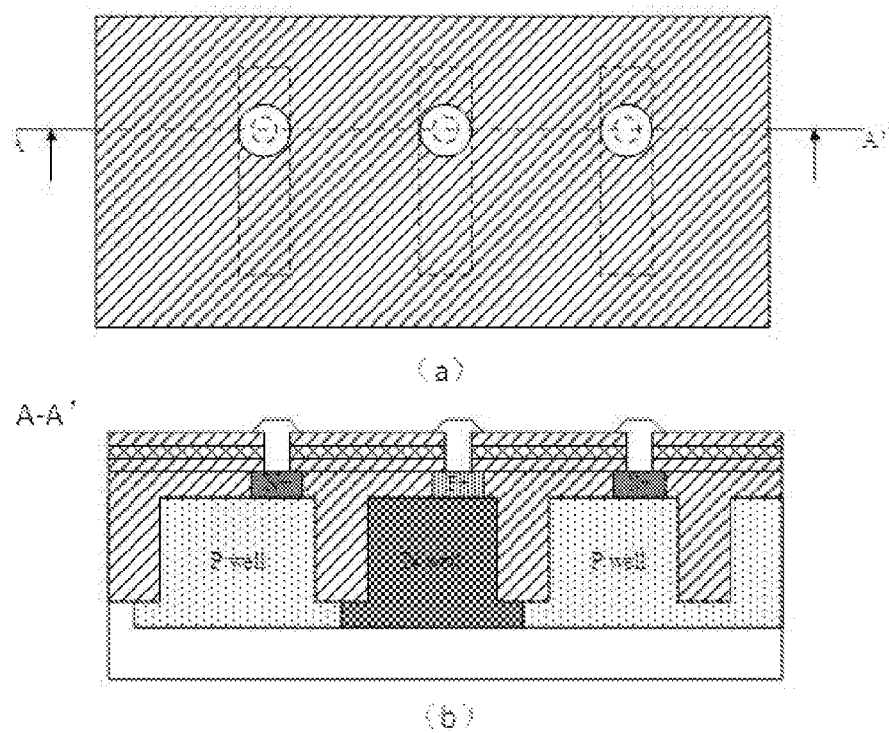
Figure 7:
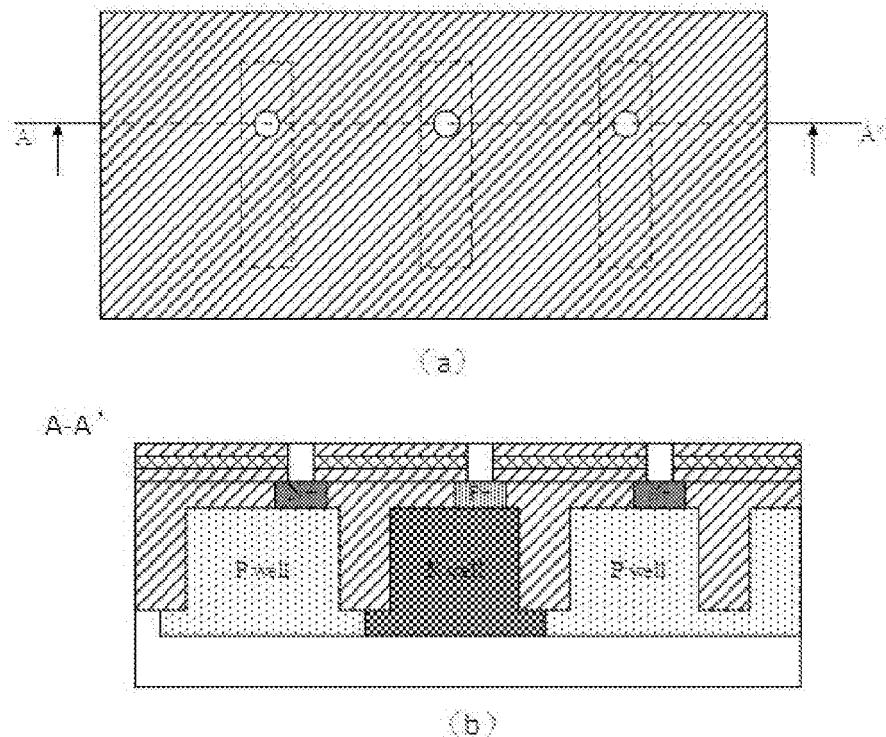
Figure 8:
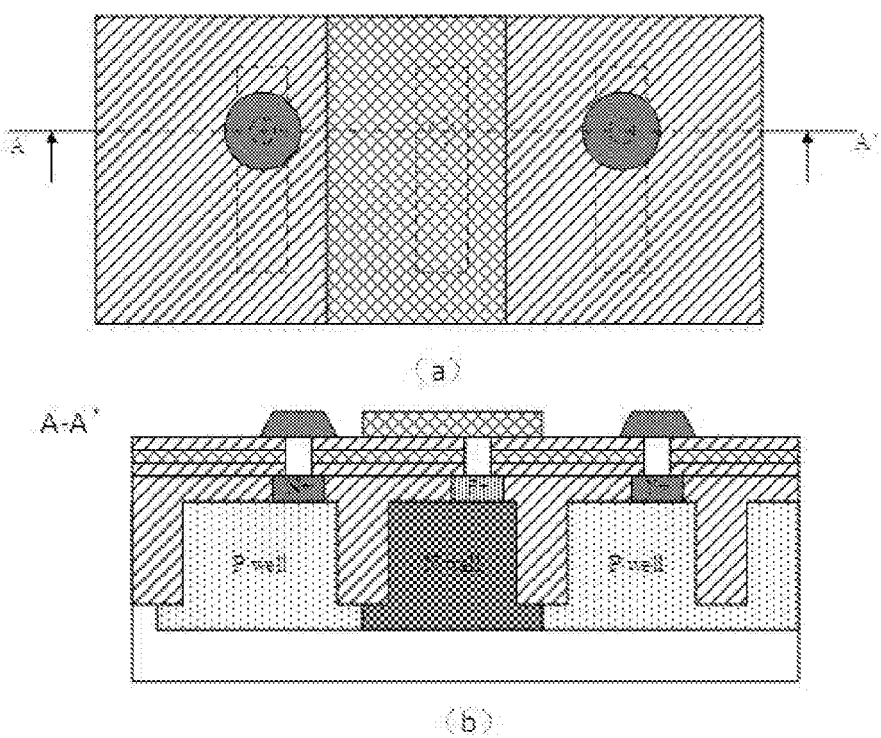
Figure 9:
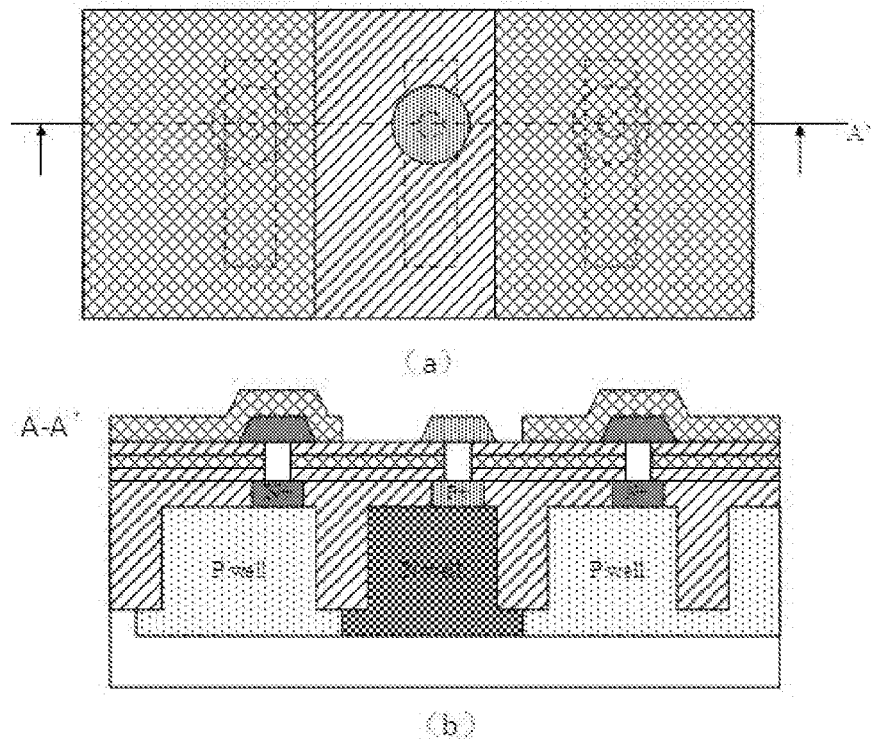
Figure 10:
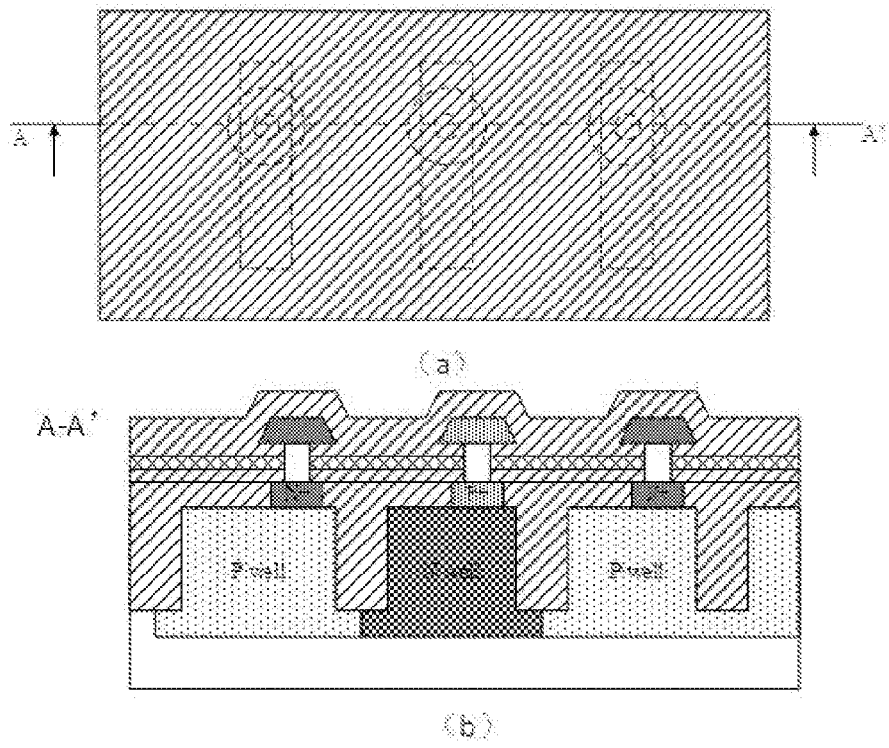
Figure 11:
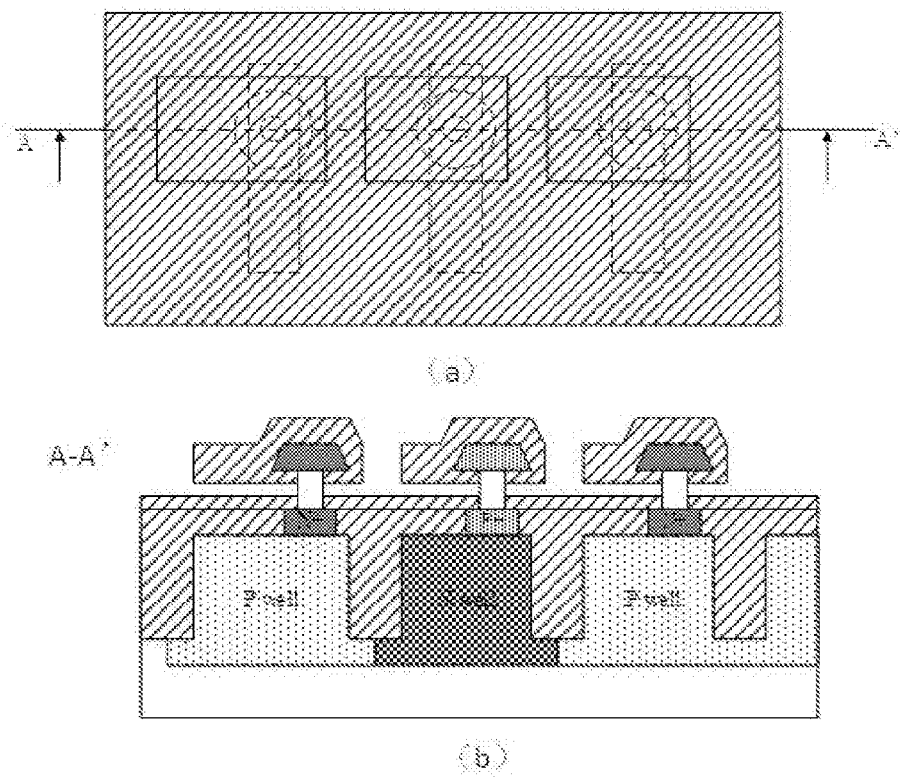
Figure 12:
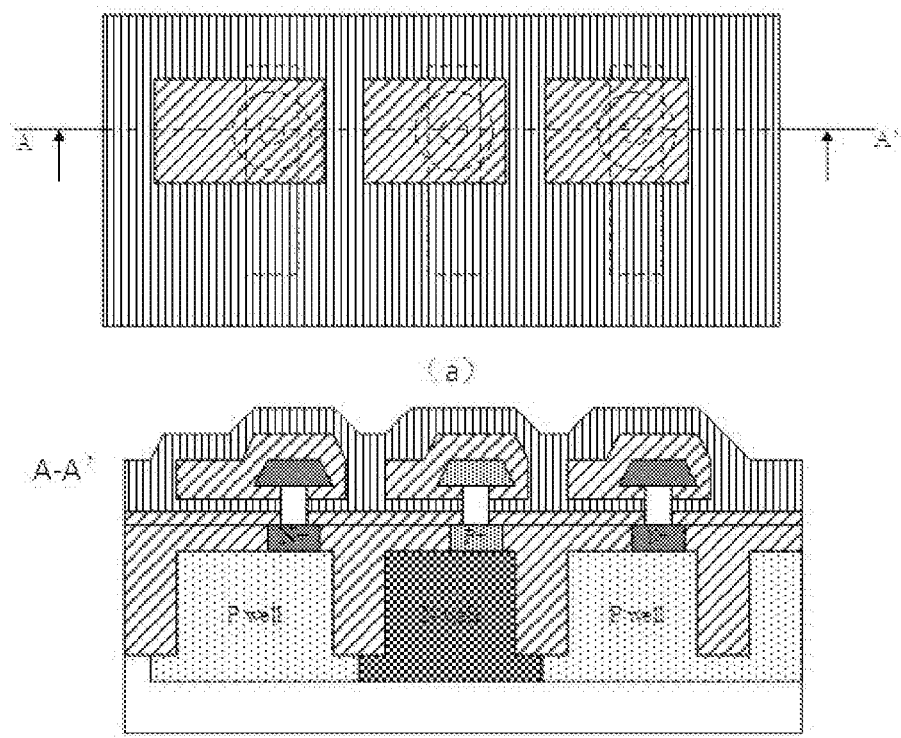
Figure 13:
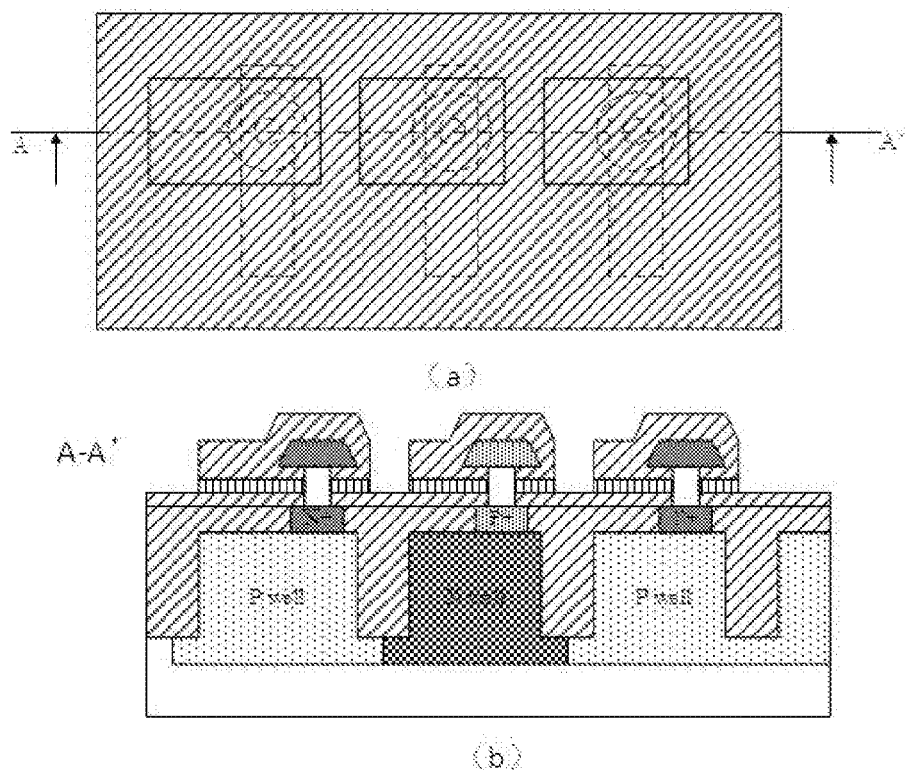
Figure 14:
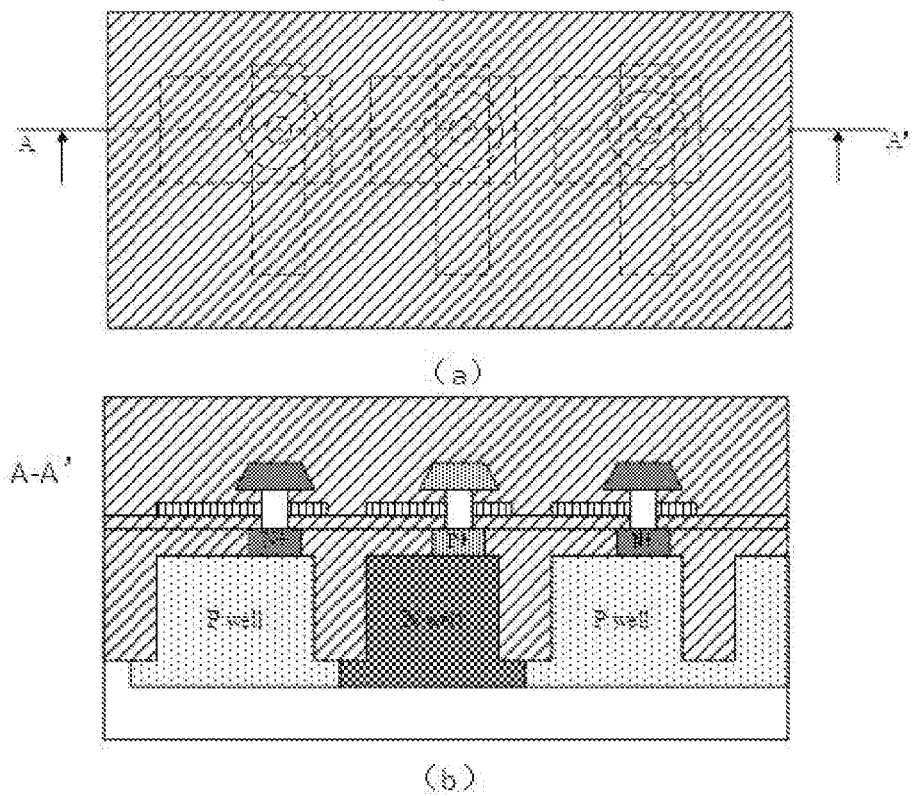
Figure 15:
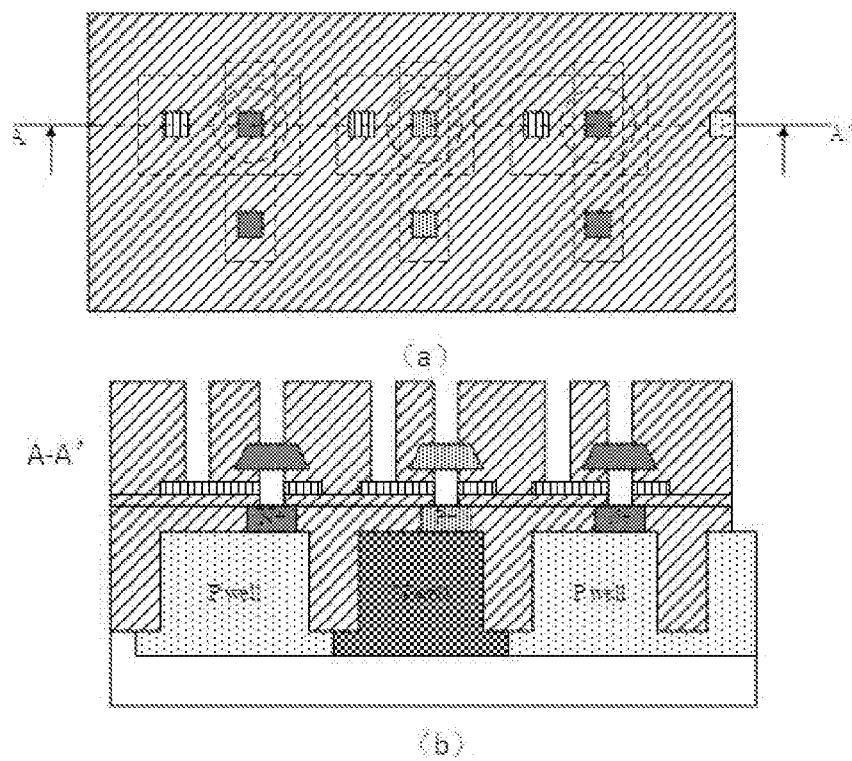
Figure 16:
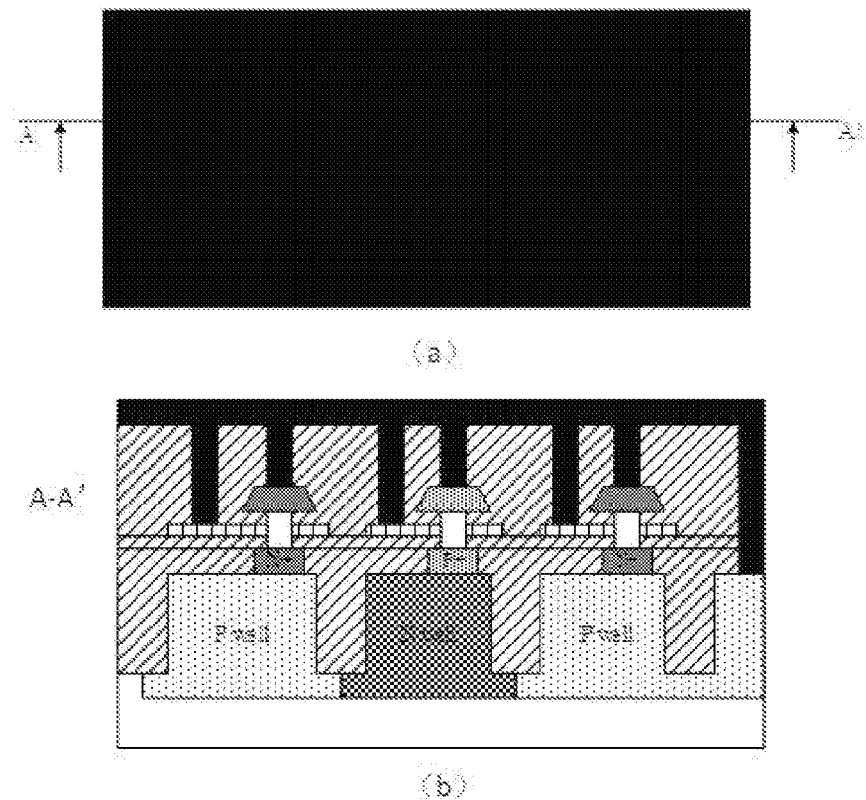
Figure 17:
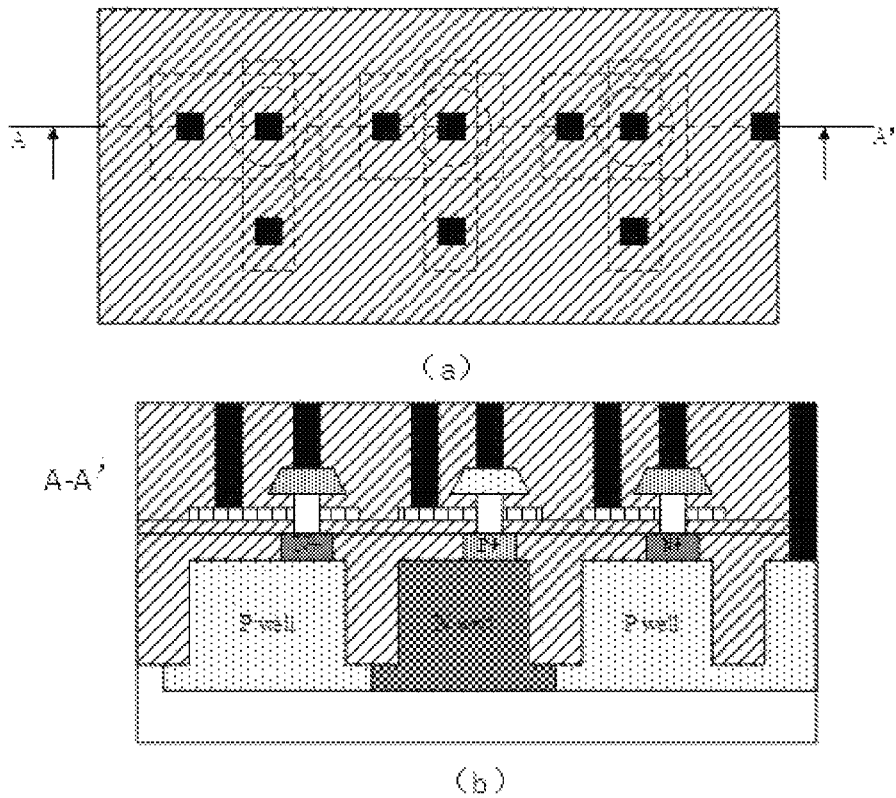
Figure 18:
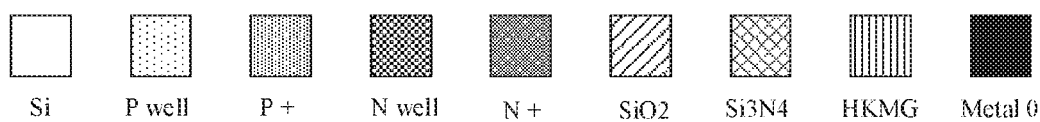

A CMOS integration (structure parameters thereof are set according to High-Performance device of "11/10 nm" node in ITRS-2013) of a bulk silicon vertical nanowire device with a diameter of 6 nm may be realized according to the steps below:

1) Double wells (N well/P well) and a shallow-trench isolation (STI) of $SiO_2$ are formed on a bulk silicon substrate (100) according to a bulk silicon process that has been disclosed, a surface planarization is performed via Chemical-Mechanical Polishing (CMP), and a $SiO_2$ of 50 nm is kept on a surface of the substrate, as shown in FIG. 2;

2) Epitaxial windows of lower active regions of the devices are formed via lithography and anisotropic etching;

3) By in-situ doped epitaxy, a P+ heavily-doped lower active region (as a source/drain terminal of a PMOS) is formed on the N well, and N+ heavily-doped lower active regions (as source/drain terminals of NMOSs) are formed on the P wells, respectively, as shown in FIG. 3;

4) a $SiO_2$ of 5 nm (as a source-drain extension region (SDE) mask layer 1, of which a thickness defines a length of the SDE of the devices as 5 nm), a $Si_3N_4$ of 17 nm (as a dummy gate layer, of which a thickness defines a channel length Lg of the devices as 17 nm) and a $SiO_2$ of 5 nm (as a SDE mask layer 2, of which a thickness defines the length of the SDE of the devices as 5 nm) are deposited sequentially via ALD, as shown in FIG. 4;

5) Epitaxial windows of the device channels (which are cylinders with a diameter of 6 nm, and through the bottom of which a heavily-doped lower active region of the NMOS/PMOS is exposed) are formed via lithography and anisotropic etching, as shown in FIG. 5;

6) Channels of the devices are formed by epitaxing undoped silicon, as shown in FIG. 6;

7) An epitaxial channel material that exceeds an upper surface of the SDE mask layer 2 are removed via CMP, to realize planarization, as shown in FIG. 7;

8) A $Si_3N_4$ of 20 nm is deposited via low pressure chemical vapor deposition (LPCVD) as a mask, and channels of the NMOSs are exposed via lithography and anisotropic etching (the $Si_3N_4$ mask covers the channels of all the PMOSs);

9) Heavily-doped upper active regions of the NMOSs (as source/drain terminals of the NMOSs) are formed via in-situ doped epitaxy;

10) The $Si_3N_4$ mask is removed, as shown in FIG. 8;

11) A $Si_3N_4$ of 20 nm is deposited as a mask via LPCVD, and a channel of the PMOS is exposed via lithography and anisotropic etching (the $Si_3N_4$ mask covers the channels and the heavily-doped upper active regions of all the NMOSs);

12) A heavily-doped upper active region of the PMOS (as a source/drain terminal of the PMOS) is formed via in-situ doped epitaxy;

13) The $Si_3N_4$ mask is removed, as shown in FIG. 9;

14) Source-drain impurities of the NMOS/PMOS are activated and diffused into the SDE region to form an LDD via an annealing process;

15) A $SiO_2$ of 30 nm is deposited as a top mask via LPCVD, as shown in FIG. 10;

16) A gate electrode is defined via lithography;

17) The $SiO_2$ of 30 nm (a top mask), the $SiO_2$ of 5 nm (the SDE mask layer 2) and the $Si_3N_4$ of 17 nm (the dummy gate layer) are removed via anisotropic etching, to expose an upper surface of the SDE mask layer 1;

18) The whole $Si_3N_4$ dummy gate layer is removed via isotropic etching, as shown in FIG. 11;

19) An HK medium material and a metal gate (MG) material are deposited sequentially via ALD, as shown in FIG. 12;

20) An HKMG material that is not covered by the top $SiO_2$ mask is removed via anisotropic etching, to expose the upper surface of the SDE mask layer 1, as shown in FIG. 13;

21) A $SiO_2$ of 200 nm is deposited as an isolation layer via PECVD, and planarization is realized via CMP, as shown in FIG. 14;

22) A contact hole on each of the gate terminal, the source terminal, the drain terminal and the bulk terminal of the device is formed via lithography and anisotropic etching, as shown in FIG. 15;

23) Each contact hole is filled with a metal Metal 0 via sputtering, as shown in FIG. 16;

24) Separation of conductive layers between devices is realized by performing CMP on the metal Metal 0, to reach an effect of device isolation, as shown in FIG. 17;

25) Device integration is accomplished subsequently by a backend process that has been disclosed.

Embodiment 2

Figure 19:
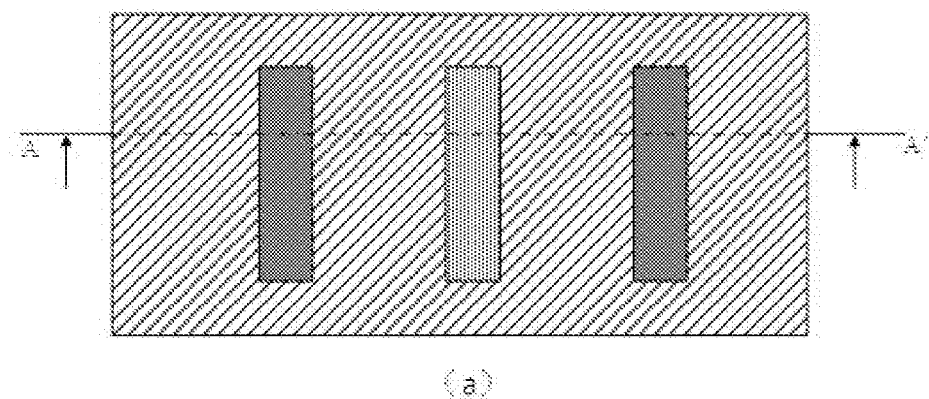
Figure 20:
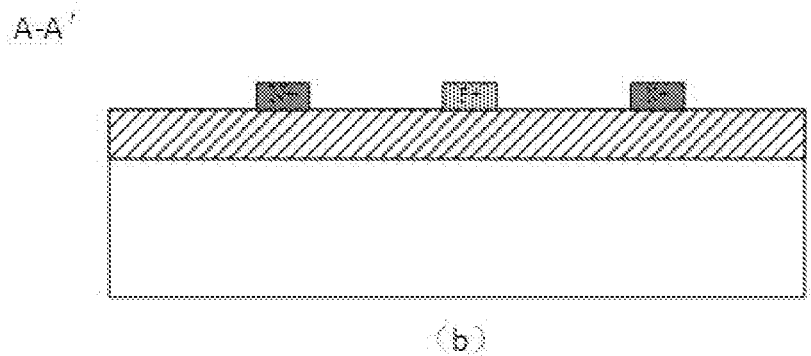
Figure 21:
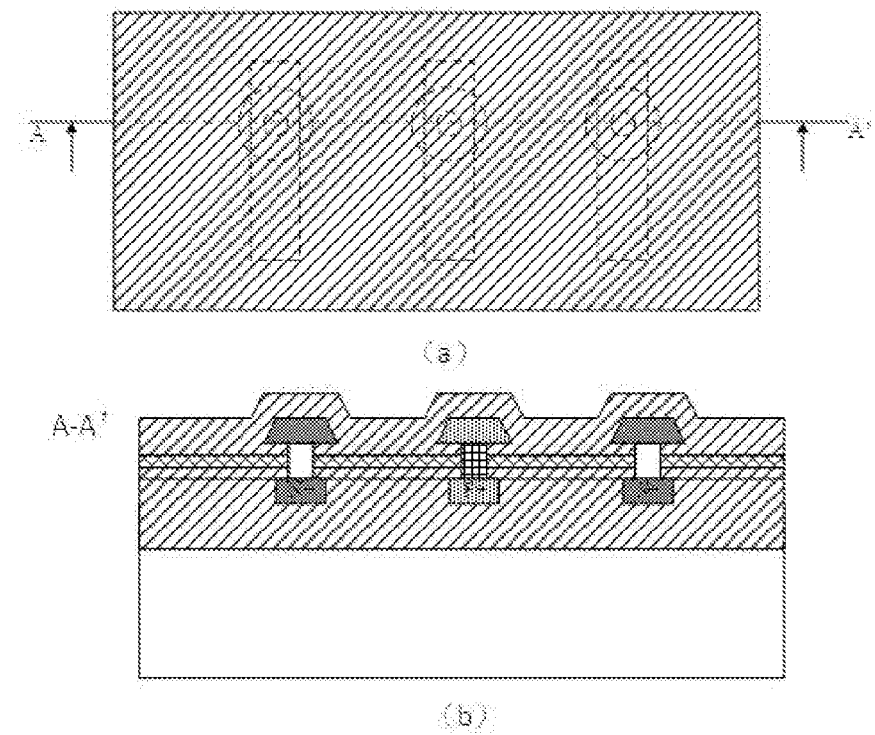
Figure 22:
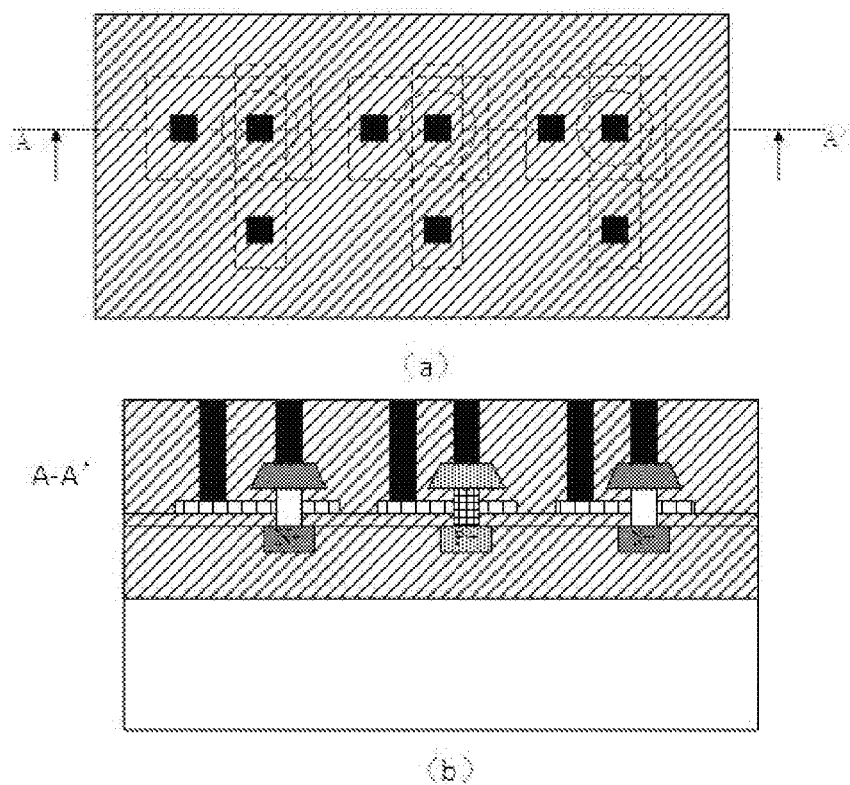
Figure 23:
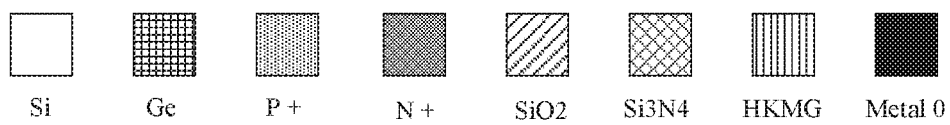

A hybrid integration (the structure parameters thereof are set according to High-Performance device of "8/7 nm" node in ITRS-2013) of a vertical nanowire device with a diameter of 4.5 nm of two kinds of material channels (for example, Si-NMOS and Ge-PMOS) on an SOI substrate may be realized according to the steps below:

1) A GeSi of 20 nm is epitaxially grown on an SOI substrate (100), and lower active regions (as source/drain terminals of the devices) are formed via N+ and P+ doping, respectively;

2) An isolation of lower active regions of the N/P devices is realized via lithography and etching, as shown in FIG. 19;

3) An STI is formed by depositing $SiO_2$ via LPCVD, and a surface planarization is performed via CMP, to expose upper surfaces of the heavily-doped lower active regions;

4) A $SiO_2$ of 3 nm (as a source-drain extension region (SDE) mask layer 1, of which a thickness defines a length of the SDE of the device as 3 nm), a $Si_3N_4$ of 14 nm (as a dummy gate layer, of which a thickness defines a channel length Lg of the device as 14 nm) and a $SiO_2$ of 3 nm (as a SDE mask layer 2, of which a thickness defines the length of the SDE of the device as 3 nm) are deposited sequentially via ALD;

5) Epitaxial windows of device channels (the windows are cylinders with a diameter of 4.5 nm, and on the bottom of which the heavily-doped lower active regions of the NMOS/PMOS are exposed) are formed via lithography and anisotropic etching;

6) P-type light-doped Si channels are formed on the lower active regions of the NMOSs and an N-type light-doped Ge channel is formed on the lower active region of the PMOS via in-situ doped epitaxy, respectively, as shown in FIG. 20;

7) An epitaxial channel material that exceeds an upper surface of the SDE mask layer 2 are removed via CMP, to realize planarization;

8) N+ heavily-doped SiGe upper active regions (as source/drain terminals of the NMOS devices) are formed on light-doped Si channels and a P+ heavily-doped SiGe upper active region (as a source/drain terminal of the PMOS device) is formed on an light-doped Ge channel via in-situ doped epitaxy, respectively;

9) Source-drain impurities of the NMOS/PMOS are activated and diffused into the SDE region to form an LDD via an annealing process;

10) a $SiO_2$ of 30 nm is deposited as a mask via LPCVD, as shown in FIG. 21;

11) A gate electrode is defined via lithography;

12) The $SiO_2$ of 30 nm (a top mask), the $SiO_2$ of 3 nm (the SDE mask layer 2) and the $Si_3N_4$ of 14 nm (the dummy gate layer) are removed via anisotropic etching, to expose an upper surface of the SDE mask layer 1;

13) The whole $Si_3N_4$ dummy gate layer is removed via isotropic etching;

14) An HK medium material and a metal gate (MG) material are deposited sequentially via ALD;

15) An HKMG material that is not covered by the top $SiO_2$ mask is removed via anisotropic etching, to expose the upper surface of the SDE mask layer 1;

16) A $SiO_2$ of 200 nm is deposited as an isolation layer via PECVD, and planarization is realized via CMP;

17) A contact hole on each of the gate terminal, the source terminal and the drain terminal of the device is formed via lithography and anisotropic etching;

18) Each contact hole is filled with a metal Metal 0 via sputtering;

19) Separation of conductive layers between devices is realized by performing CMP on the metal Metal 0, to reach an effect of device isolation, as shown in FIG. 22;

20) Device integration is accomplished subsequently by a backend process that has been disclosed.

The above embodiments of the invention do not intend to limit the invention. Many possible variations and modifications or equivalent embodiments may be made on the technical solutions of the invention by one skilled in the art based on the method and technical contents disclosed above, without departing from the scope of the technical solutions of the invention. Therefore, any simple modifications, equivalent variations and modifications made on the above embodiments based on the technical principle of the invention, without departing from the contents of the technical solutions of the invention, will pertain to the protection scope of the technical solutions of the invention.

What is claimed is:

1. An integration method for a vertical nanowire transistor, comprising:
   A) providing a semiconductor substrate, and forming an isolation between devices;
   B) forming heavily-doped lower active regions of the devices;
   C) depositing a dummy gate stack layer, which specifically comprises the steps of:
      C1) depositing a medium layer as a first source-drain extension region (SDE) mask layer, of which a thickness defines a length of a source-drain extension region (SDE) of the devices;
      C2) depositing a medium layer as a dummy gate layer, of which a thickness defines a channel length Lg of the devices;
      C3) depositing a medium layer as a second SDE mask layer, of which a thickness defines the length of a source-drain extension region (SDE) of the devices;
   D) forming channels by selective epitaxy, which specifically comprises the steps of:
      D1) defining epitaxial windows of the channels via lithography, of which sizes and shapes determine sizes and shapes of cross sections of the channels of the devices;
      D2) forming the epitaxial windows of the channels via anisotropic etching, through the bottom of which the heavily-doped lower active regions of the devices are exposed;
      D3) forming the channels of the devices via epitaxy, and removing an epitaxial channel material that exceeds an upper surface of the second SDE mask layer via CMP, to realize planarization;

E) forming heavily-doped upper active regions of the devices by selective epitaxy, which specifically comprises the steps of:
  E1) depositing a medium layer as a hard mask, and exposing channels of NMOSs via lithography and anisotropic etching;
  E2) forming heavily-doped upper active regions of the NMOSs via in-situ doped epitaxy;
  E3) removing the hard mask;
  E4) depositing a medium layer as a hard mask, and exposing channels of a PMOSs via lithography and anisotropic etching;
  E5) forming a heavily-doped upper active region of the PMOS via in-situ doped epitaxy;
  E6) removing the hard mask;
  E7) activating source-drain impurities via an annealing process, and diffusing the source-drain impurities into the SDE region to form an LDD;
F) removing the dummy gate layer, depositing and forming a gate electrode and high K material, which specifically comprises the steps of:
  F1) depositing a medium layer as a top mask layer;
  F2) defining the gate electrode via lithography;
  F3) exposing an upper surface of the first SDE mask layer via anisotropic etching;
  F4) removing the whole dummy gate layer via isotropic etching;
  F5) sequentially depositing a high-K medium material as gate oxide and a metal gate material;
  F6) removing the high K and gate material that is not covered by the top mask layer via anisotropic etching, to expose the upper surface of the first SDE mask layer;
H) forming a metal contact on each terminal of the devices, which specifically comprises the steps of:
  H1) depositing a medium layer as an inter-layer isolation, and realizing planarization via CMP;
  H2) forming a contact hole on each terminal of the devices via lithography and anisotropic etching;
  H3) filling each contact hole with a metal;
  H4) realizing the separation of conductive layers between devices by performing CMP on the metal, to realize an effect of device isolation;
I) accomplishing device integration subsequently by a backend process.

2. The integration method according to claim 1, wherein, the semiconductor substrate is a bulk silicon substrate, an SOI substrate, a bulk germanium substrate, a GOI substrate or a compound substrate.

3. The integration method according to claim 1, wherein, for a bulk substrate, the isolation in the step A employs well isolation plus shallow-trench isolation; and for an SOI substrate or a GOI substrate, the isolation in the step A employs shallow-trench isolation.

4. The integration method according to claim 1, wherein, in the step C, the materials of the first SDE mask layer and the second SDE mask layer are the same as each other but are different from the material of the dummy gate layer, and the isotropic etching selection ratios of the material of the dummy gate layer to the first SDE mask layer and the second SDE mask layer are both greater than 5:1.

5. The integration method according to claim 1, wherein, in the step F1, the material of the top mask layer is different from the material of the dummy gate layer, and the isotropic etching selection ratio of the material of the dummy gate layer to the top mask layer is greater than 5:1.

6. The integration method according to claim 1, wherein, in the step F1, the thickness of the top mask layer requires that the top mask layer still remains on the upper active regions of the devices after removing the HKMG material that is not covered by the top mask layer via anisotropic etching to expose the upper surface of the first SDE mask layer in F6.

7. The integration method according to claim 1, wherein, the metal in the step H3 is W or Cu.

\* \* \* \* \*